United States Patent [19]

Chapman et al.

[11] 4,233,575
[45] Nov. 11, 1980

[54] WIDE FREQUENCY RANGE CURRENT-CONTROLLED OSCILLATOR

[75] Inventors: Ronald H. Chapman, Wheaton, Ill.; Kenneth A. Hansen, Bedford, Tex.

[73] Assignee: Motorola, Inc., Schaumburg, Ill.

[21] Appl. No.: 34,303

[22] Filed: Apr. 30, 1979

Related U.S. Application Data

[63] Continuation of Ser. No. 951,094, Oct. 13, 1978, abandoned.

[51] Int. Cl.$^2$ .............................................. H03K 3/26
[52] U.S. Cl. ...................................... 331/111; 332/9 T
[58] Field of Search ............... 331/111, 108 C, 108 D, 331/113 R, 177 R, 143; 332/9 T

[56] References Cited

U.S. PATENT DOCUMENTS

| | | | |
|---|---|---|---|
| 3,659,224 | 4/1972 | Ball | 331/111 |
| 3,904,988 | 9/1975 | Hsiao | 331/111 |
| 3,924,202 | 12/1975 | Craft | 331/111 |
| 3,946,330 | 3/1976 | Takahashi | 331/111 X |
| 3,995,232 | 11/1976 | Laugesen | 331/111 |
| 4,023,122 | 5/1977 | Oura | 331/111 |
| 4,035,744 | 7/1977 | Fukaya et al. | 331/111 |
| 4,095,194 | 6/1978 | Hoehn et al. | 331/111 X |

OTHER PUBLICATIONS

Allen et al., "A Wide Range Voltage-Controlled Oscillator", IEEE Transactions on Instrumentation and Measurement, vol. IM—24, No. 3, Sep. 1975, pp. 255-261.
"Signetics Analog Data Manual" by Signetics Corporation, 1977, p. 832.

Primary Examiner—Siegfried H. Grimm
Attorney, Agent, or Firm—Rolland R. Hackbart; James W. Gillman

[57] ABSTRACT

A wide frequency range current-controlled oscillator (CCO) provides a digital output signal that is frequency controllable by an input control current. The CCO includes a differential voltage comparator coupled to a timing capacitor for controlling charging and discharging currents applied to the timing capacitor. The charging and discharging currents are dependent on the input control current. The magnitude of the discharging current may be varied to control the duty cycle of the digital output signal.

11 Claims, 2 Drawing Figures

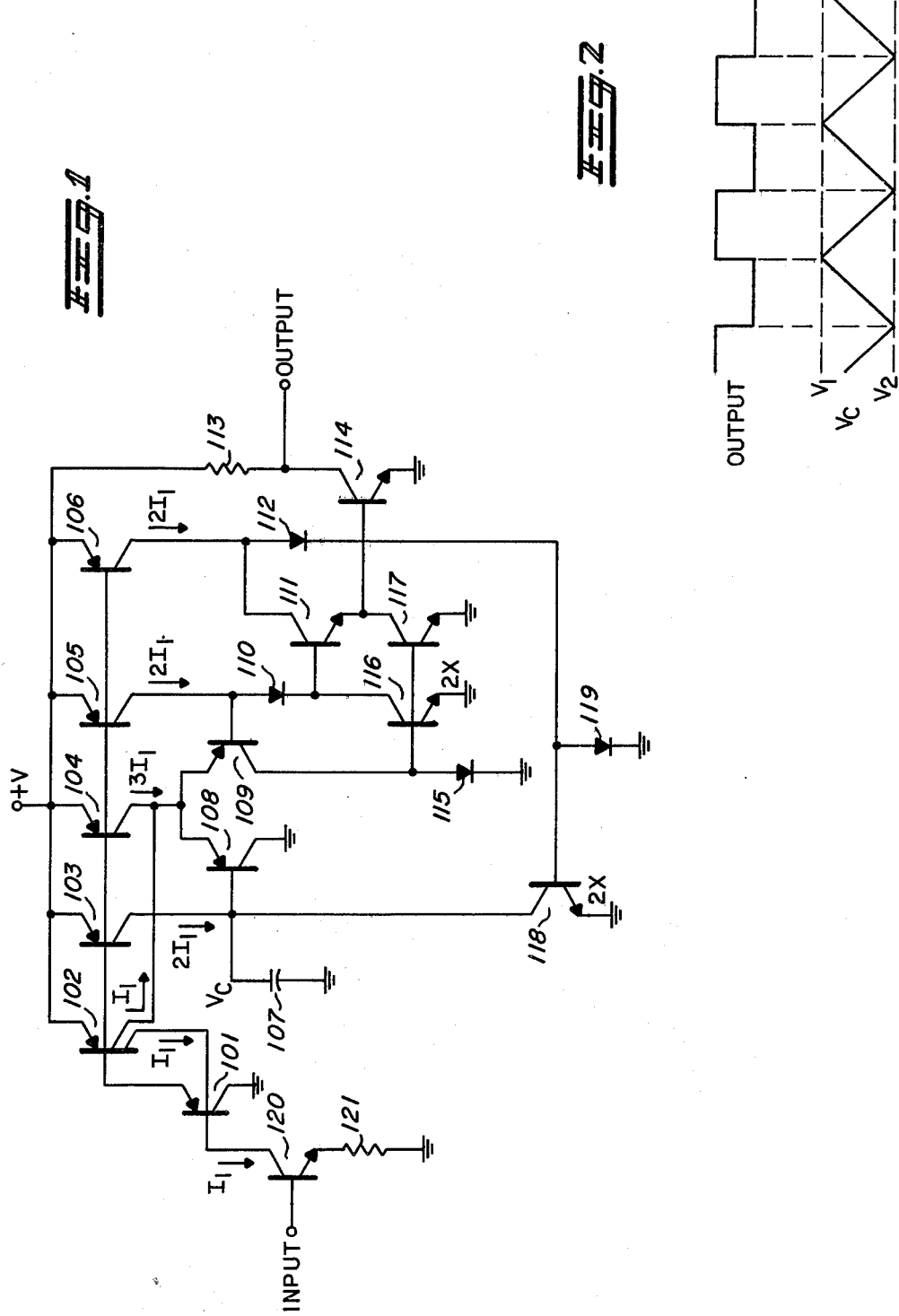

WIDE FREQUENCY RANGE CURRENT-CONTROLLED OSCILLATOR

This is a continuation, of application Ser. No. 951,094, filed Oct. 13, 1978 and now abandoned.

TECHNICAL FIELD

The present invention relates to current-controlled oscillators, and more particularly, to a wide frequency range programmable current-controlled oscillator.

BACKGROUND ART

Current-controlled oscillators (CCO's) of the prior art have typically utilized a Schmitt trigger to control the charging and discharging currents to the CCO timing capacitor. For example, the Signetics 565, illustrated in the Signetics Analog Data Manual, published by Signetics Corporation, 1977 at pages 832 and 833, is basically comprised of a programmable current source and a Schmitt trigger coupled to a timing capacitor. Another current-controlled oscillator described in U.S. Pat. No. 3,659,224, uses two comparators for comparing the CCO timing capacitor voltage to a pair of independent reference voltages. Both of the foregoing CCO's require a relatively large number of electrical components and are limited to operating frequencies less than 500 KHz. The frequency range of a CCO may be increased somewhat by utilizing the techniques described in the article, "A Wide Range Voltage-Controlled Oscillator", by Phillip E. Allen and William J. Parrish, published in the IEEE transactions on Instrumentation and Measurement, VOL. IM-24, No. 3, September 1975 at pages 253-261.

SUMMARY OF THE INVENTION

It is a general object of the present invention to provide an improved wide frequency range current-controlled oscillator that is operable at relatively high frequencies.

It is another object of the present invention to provide an improved current-controlled oscillator that is readily adaptable to integrated circuit fabrication.

It is a further object of the present invention to provide an improved current-controlled oscillator having a programmable operating frequency and readily controllable duty cycle.

In practicing the invention, a current-controlled oscillator includes a timing capacitor that is alternately charged and discharged to generate a digital output signal having a frequency controllable by an input control current. The current-controlled oscillator further includes a current source, a switchable current mirror, a differential voltage comparator and a switchable reference voltage circuit. The current source is coupled to the input control current for providing a first current having a predetermined first magnitude to the timing capacitor. The switchable current mirror is connected to the junction of the timing capacitor and current source for sinking a current having a magnitude related to the magnitude of the first current by a predetermined factor. The differential voltage comparator is differentially coupled to the timing capacitor and the switchable reference voltage circuit for differentially comparing the timing capacitor voltage to first and second reference voltages provided by the switchable reference voltage circuit. The differential comparator provides an output signal when the timing-capacitor voltage is greater than the first reference voltage from the switchable reference voltage circuit. In response to the differential-comparator output signal, the switchable reference voltage circuit couples the second reference voltage (less than the first reference voltage) to the differential voltage comparator, enables the switchable current mirror to discharge the timing capacitor and provides a predetermined first state of the digital output signal. The differential voltage comparator turns off and no longer provides the differential-comparator output signal when the timing-capacitor voltage discharges to substantially the same magnitude as the second reference voltage. In response to the absence of the differential-comparator output signal, the switchable voltage reference circuit couples the first reference voltage to the differential voltage comparator, disables the switchable current mirror to charge the timing capacitor and provides a predetermined second state of the digital output signal. The foregoing operation of the current-controlled oscillator is repeated to provide successive cycles of the digital output signal.

BRIEF DESCRIPTION OF THE DRAWINGS

FIG. 1 illustrates a circuit diagram of a current-controlled oscillator embodying the present invention.

FIG. 2 illustrates waveforms of the digital output signal and the timing capacitor voltage of the current-controlled oscillator of FIG. 1.

DETAILED DESCRIPTION OF THE INVENTION

In FIG. 1, there is illustrated a current-controlled oscillator (CCO) embodying the present invention. The CCO is operable over a relatively wide range of frequencies that may extend up to 1.5 MHz. The CCO is readily integrable onto an integrated circuit substrate using any suitable integration technique, such as, linear compatible $I^2L$ techniques.

The CCO accepts an input control voltage at the base of transistor 120 and provides a digital output signal at the collector of transistor 114. The input control voltage is applied across resistor 121 by transistor 120 for establishing the magnitude of the control current $I_1$. The control current $I_1$ is applied to current mirror transistors 101 to 106 for providing dependent currents to the circuitry of the CCO. The geometry of the devices is scaled such that the collector currents from transistors 103-106 are twice the magnitude of control current $I_1$. The CCO further includes a timing capacitor 107, a differential comparator 108-109, a switchable voltage reference circuit 110-117 and a switchable current mirror 118-119. The waveforms of the timing capacitor voltage $V_c$ and the digital output signal are illustrated in FIG. 2. In the preferred embodiment of the CCO, the timing capacitor 107 is symmetrically charged and discharged between voltage levels $V_1$ and $V_2$, respectively, by essentially equal magnitude currents $2I_1$, resulting in a 50% duty cycle on the digital output signal. Further more, the duty cycle of the digital output signal may be altered to any desired duty cycle by appropriately adjusting the magnitude of the discharging current provided by current mirror 118-119.

The CCO may be operated from any suitable DC supply voltage which may be as low as 3 VDC and as large as the rated breakdown voltage of the transistor devices. The timing capacitor 107 is charged by current $2I_1$ provided by transistor 103 until voltage level V1 is reached, at which time the voltage reference circuit 110-117 switches the voltage level from $V_1$ to $V_2$ and enables current mirror 118-119 to sink a current $4I_1$. The enabled current mirror 118-119 sinks the current $2I_1$ from transistor 103 and a current $2I_1$ from the timing capacitor 107. Thus, the timing capacitor 107 is charged and discharged by a current $2I_1$, resulting in the essentially symmetrical, saw-toothed voltage waveform and corresponding digital output signal illustrated in FIG. 2.

Transistors 108 and 109 form a differential voltage comparator that is fed by a current $3I_1$ from transistors 102 and 104. The timing capacitor voltage $V_c$ at the base of transistor 108 is referenced to the voltage at the base of transistor 109. When the timing capacitor 107 is charging, transistor 108 is on and transistor 109 is off. The timing capacitor 107 continues to charge until the timing capacitor voltage $V_c$ reaches the voltage level $V_1$, formed by diode 110, the base-emitter junction of transistor 111 and the base-emitter junction of transistor 114. However, until the timing capacitor voltage $V_c$ reaches the voltage level $V_1$, the current $2I_1$ provided by transistor 105 is coupled by way of diode 110 to transistors 111 and 114. Thus, transistor 111 is turned on to sink the current $2I_1$ provided by transistor 106 and to keep switchable current mirror 118-119 turned off. Transistor 114 is also turned on to provide a logic low state (low voltage) on the digital output signal.

When the timing capacitor voltage $V_c$ reaches the voltage level $V_1$, transistor 108 turns off and transistor 109 turns on. The turning on of transistor 109 enables the current mirror 115-116. Transistor 116 of the enabled current mirror 115-116 sinks the current $2I_1$ from transistor 105 by way of diode 110, turning off transistors 111 and 114. Transistor 117 sinks the stored charge from the base of transistor 114 to insure that transistor 114 turns off rapidly. In the off state, transistor 114 provides a logic high state (high voltage +V) on the digital output signal. Furthermore, since transistor 111 is turned off, the current $2I_1$ from transistor 106 is applied to current mirror 118-119 via diode 112. Transistor 118 of the enabled current mirror 118-119 sinks a current $4I_1$ for discharging the timing capacitor 107.

When the timing capacitor voltage VC reaches the voltage level $V_2$, formed by diode 110 and the collector to emitter saturation voltage of transistor 116, transistor 109 turns off and transistor 108 turns on again and the timing capacitor 107 begins charging. The foregoing operation is repeated during successive charging and discharging cycles of the CCO. Since the switching between charging and discharging cycles is controlled by the differential voltage comparator 108-109, the switching time is greatly decreased over the switching time of oscillators utilizing Schmitt triggers. Since the switching times are much faster than prior art oscillators, the CCO of the present invention may operate at much higher frequencies than prior art oscillators. In addition, all of the current mirror transistors 101 to 106 provide currents that are a function of the current $I_1$, and therefore the CCO is more tolerant to transistor device variations and provides more symmetrical waveforms.

The frequency of operation of the CCO is varied in response to the input control voltage at the base of transistor 120. Variations of the input control voltage are applied across resistor 121 and directly vary the control current $I_1$. The varying of the control current $I_1$ varies the charge and discharge current to the timing capacitor 107, which provides a corresponding adjustment to the oscillating frequency of the CCO. The frequency F of operation of the CCO may be expressed by the following equation:

$$F = I_1/C(V_1 - V_2),$$

where C is the magnitude of the timing capacitor 107.

Although the CCO has been shown with an input control voltage at transistor 120, the CCO may also be configured to accept an input control current $I_1$ directly at transistor 101, thus eliminating transistor 120 and resistor 121. The CCO of the present invention may be advantageously utilized in applications, such as portable radios, where it is desirable to minimize the number of circuit elements without degrading performance characteristics.

We claim:

1. A current-controlled oscillator for providing a digital output signal that is frequency controllable by an input control current, said current-controlled oscillator comprising:

timing-capacitor means for storing a timing-capacitor voltage;

current source means coupled to the timing capacitor means and the input control current for providing a first current having a predetermined magnitude dependent on the magnitude of the input control current;

differential voltage comparator means having first and second inputs, the second input coupled to the junction of the timing-capacitor means and the current source means for comparing the timing-capacitor voltage with the voltage at the differential-comparator first input and providing an output signal when the magnitude of the timing-capacitor voltage is greater than the magnitude of the voltage at the differential-comparator first input;

switchable current mirror means coupled to the junction of the timing-capacitor means and the current source means for sinking when enabled a second current having a magnitude that is related to the magnitude of the first current by a predetermined factor greater than one; and switchable reference voltage means having first and second reference voltages, the first reference voltage greater than the second reference voltage, said switchable reference voltage means coupling the first reference voltage to the differential-comparator first input, disabling the switchable current mirror means to charge the timing capacitor means and providing a predetermined second state of the digital output signal when the differential-comparator output signal is not present, and coupling the second reference voltage to the differential-comparator first input, enabling the switchable current mirror means to discharge the timing capacitor means and providing a predetermined first state of the digital output signal when the differential-comparator output signal is present.

2. The current-controlled oscillator according to claim 1, wherein the predetermined factor is two, the current-controlled oscillator providing a digital output signal with substantially a fifty percent duty cycle.

3. The current-controlled oscillator according to claims 1 or 2, further including a semiconductive substrate, said current-controlled oscillator comprised of electrical circuit elements integrated into the semiconductive substrate.

4. A current-controlled oscillator for providing a digital output signal that has a frequency controllable by an input control current and that has substantially a fifty percent duty cycle, said current-controlled oscillator comprising:

a timing-capacitor for storing a timing-capacitor voltage;

a first current mirror coupled to the timing capacitor and the input control current for providing a current having a magnitude substantially the same as the magnitude of the input control current;

a differential voltage comparator having first and second inputs, the second input coupled to the junction of the timing capacitor and the first current mirror for comparing the timing-capacitor voltage with the voltage at the differential-comparator first input and providing an output signal when the magnitude of the timing-capacitor voltage is greater than the magnitude of the voltage at the differential-comparator first input;

a first switchable current mirror coupled to the junction of the timing-capacitor and the first current mirror for sinking when enabled a current having a magnitude that is substantially twice the magnitude of the input control current; and a switchable reference voltage circuit having first and second reference voltages, the first reference voltage greater than the second reference voltage, said switchable reference voltage circuit coupling the first reference voltage to the differential-comparator first input, disabling the first switchable current mirror to charge the timing capacitor and providing a predetermined second state of the digital output signal when the differential-comparator output signal is not present; and coupling the second reference voltage to the differential-comparator first input, enabling the first switchable current mirror to discharge the timing capacitor and providing a predetermined first state of the digital output signal when the differential-comparator output signal is present.

5. The current-controlled oscillator according to claim 4, wherein said differential voltage comparator includes first and second transistors, the base terminal of the first transistor providing the differential-comparator first input and the base terminal of the second transistor providing the differential-comparator second input.

6. The current controlled oscillator according to claim 5, wherein the switchable reference voltage circuit includes:

a second current mirror coupled to the input control current and the base terminal of the first transistor for providing a current having a magnitude that is substantially twice the magnitude of the input control current;

a first diode having an anode terminal coupled to the junction of the second current mirror and the base terminal of the first transistor;

a third transistor having a base terminal connected to the cathode of the first diode and a collector terminal connected to the switchable current mirror;

a third current mirror coupled to the input control current for providing a current that is substantially twice the magnitude of the input control current to the junction of the collector terminal of the third transistor and the switchable current mirror;

a fourth transistor having a base terminal connected to the emitter terminal of the third transistor, having an emitter terminal connected to signal ground and having a collector terminal for providing the digital output signal; and a second switchable current mirror including a diode and a transistor wherein the base and anode terminals are connected to the collector terminal of the first transistor, the cathode and emitter terminals are connected to signal ground and the collector terminal is connected to the cathode terminal of the first diode; the second switchable current mirror enabled by the presence of the differential-comparator output signal to conduct the current from the second current mirror via the first diode, the third and fourth transistors being turned off by the enabled second switchable current mirror, and the current from the third current mirror enabling the first switchable current mirror; and the second switchable current mirror disabled by the absence of the differential-comparator output signal, the current from the second current mirror via the first diode turning on the third and fourth transistors, and the current from the third current mirror being conducted by the third and fourth transistors to disable the first switchable current mirror.

7. The current-controlled oscillator according to claim 6, further including a second diode interposed between the first switchable current mirror and the junction of the collector terminal of the third transistor and the third current mirror, the anode terminal of the second diode being coupled to the junction of the collector terminal of the third transistor and the third current mirror, and the cathode terminal of the second diode being coupled to the switchable current mirror.

8. The current-controlled oscillator according to claim 7, further including a semiconductive substrate, said current-controlled oscillator comprised of electrical circuit elements integrated into the semiconductive substrate.

9. A current-controlled oscillator for providing an oscillator signal that is frequency controllable by an input control current, said current-controlled oscillator comprising:

timing-capacitor means for storing a timing-capacitor voltage;

current source means coupled to the timing capacitor means and the input control current for providing a first current having a predetermined magnitude dependent on the magnitude of the input control current;

switchable current mirror means coupled to the junction of the timing-capacitor means and the current source means for sinking when enabled, a second current having a magnitude that is related to the magnitude of the first current by a predetermined factor greater than one; and differential voltage comparator means having first and second reference voltages, where the first reference voltage is greater than the second reference voltage, the differential voltage comparator means coupled to the junction of the timing-capacitor means and the current source means for comparing the timing capacator voltage with the first and second reference voltages, the differential comparator means enabling the switchable current mirror means when the magnitude of the timing-capacitor voltage is substantially the same as the magnitude of the first reference voltage and subsequently disabling the switchable current mirror means when the magnitude of the timing-capacitor voltage is substantially the same as the magnitude of the second reference voltage.

10. The current-controlled oscillator according to claim 9, wherein the predetermined factor is two, the current-controlled oscillator providing an oscillator signal with substantially a fifty percent duty cycle.

11. The current-controlled oscillator according to claims 9 or 10, further including a semiconductive substrate, said current-controlled oscillator comprised of electrical circuit elements integrated into the semiconductive substrate.

* * * * *